United States Patent [19]
Oshino et al.

[11] Patent Number: 5,349,236
[45] Date of Patent: Sep. 20, 1994

[54] REUSABLE FIXTURE FOR CARRIER TAPE

[75] Inventors: Fumio Oshino; Masahiko Yamaki, both of Nagoya, Japan

[73] Assignee: Mitsui Toatsu Chemicals, Incorporated, Tokyo, Japan

[21] Appl. No.: 92,524

[22] Filed: Jul. 16, 1993

[30] Foreign Application Priority Data

Jul. 21, 1992 [JP] Japan .................................. 4-194170

[51] Int. Cl.⁵ ...................... H01L 23/48; H01L 21/00
[52] U.S. Cl. ..................................... 257/701; 257/668; 257/727; 29/760; 29/761; 206/330; 361/785
[58] Field of Search ........................ 257/668, 701, 727; 361/785; 206/330; 29/760, 761

[56] References Cited

U.S. PATENT DOCUMENTS

| | | | |
|---|---|---|---|
| 4,007,479 | 2/1977 | Kowalski | 357/70 |
| 4,069,496 | 1/1978 | Kowalski | 357/70 |
| 4,547,794 | 10/1985 | Tang | 29/760 |
| 4,696,526 | 9/1987 | Newton | 439/68 |
| 4,937,655 | 6/1990 | Miyazaki | 357/70 |
| 5,101,975 | 4/1992 | Runyon et al. | 206/330 |

FOREIGN PATENT DOCUMENTS

0472435 2/1992 European Pat. Off. .
WO90/01793 2/1990 PCT Int'l Appl. .

Primary Examiner—Rolf Hille
Assistant Examiner—David Ostrowski
Attorney, Agent, or Firm—Burns, Doane, Swecker & Mathis

[57] ABSTRACT

The present invention is a reusable fixture for holding a TCP carrier tape that is of simple structure, allows the carrier tape to be held securely, and eliminates powder produced by friction during mounting of the carrier tape. The structure includes a reusable fixture with a bottom element for receiving the carrier tape, a frame that surrounds and protects an outer periphery of the bottom element, and a pair of resilient tape holding members for holding the carrier tape that can be deformed by a pair of engaging members that move in opposing directions along the same line so as to allow mounting of the carrier tape, the tape holding members being attached on at least one pair of opposing inner side faces of the frame at positions to allow the tape holding members to extend above the upper surface of the mounted carrier tape.

4 Claims, 10 Drawing Sheets

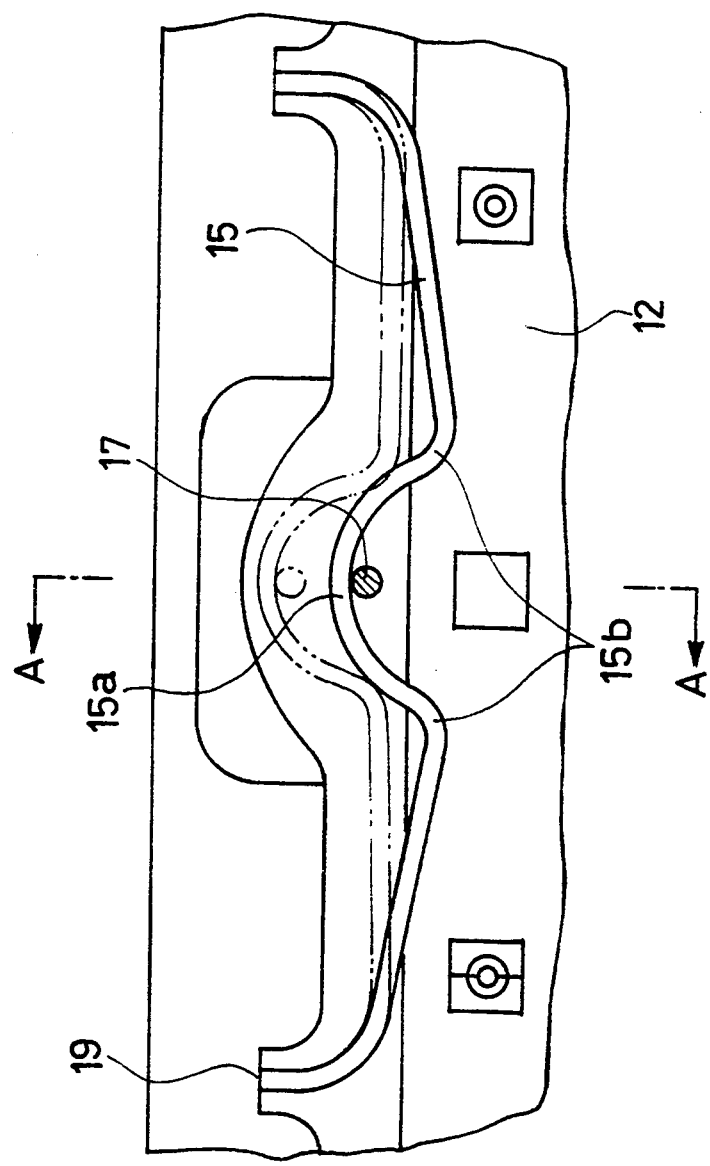

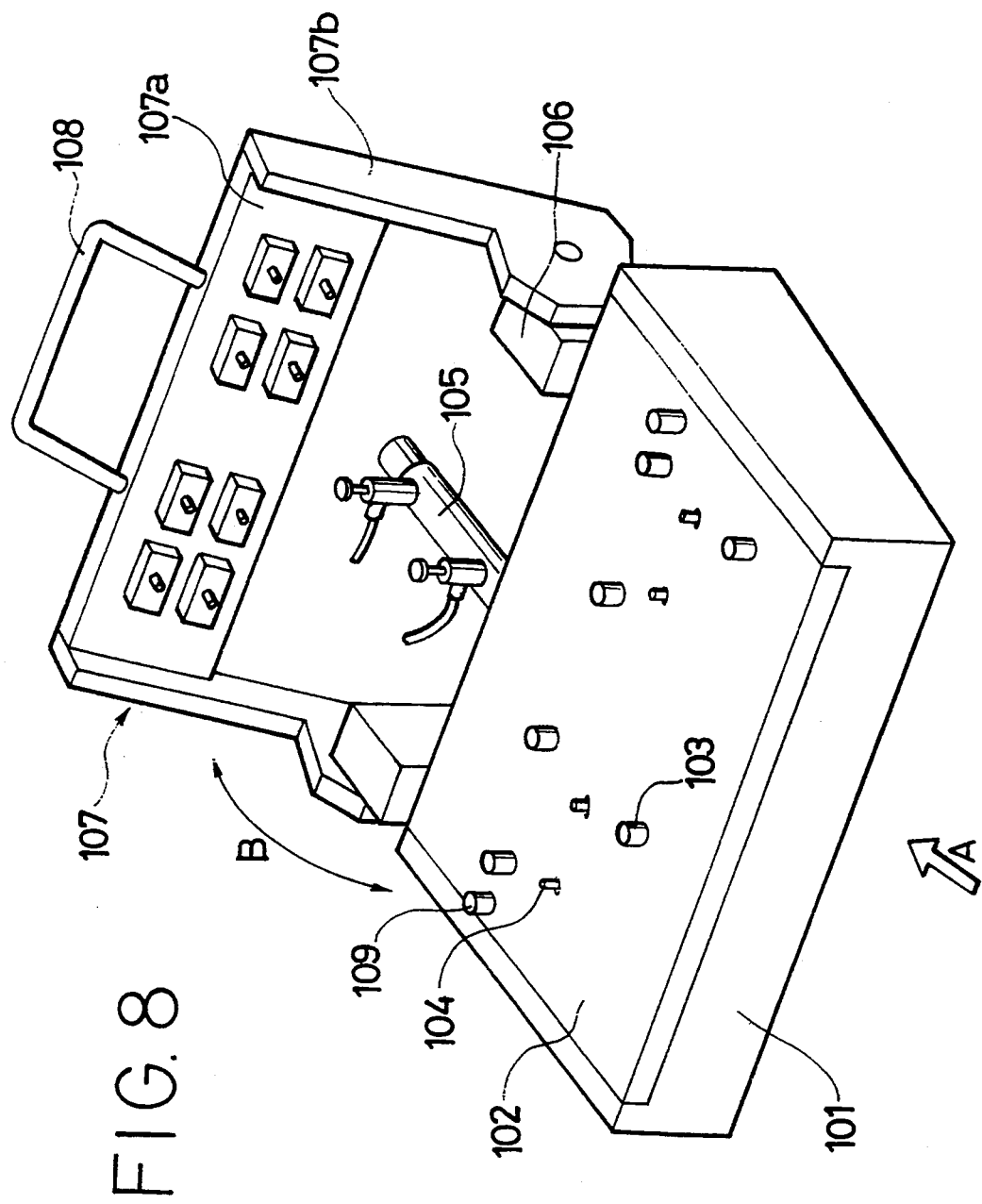

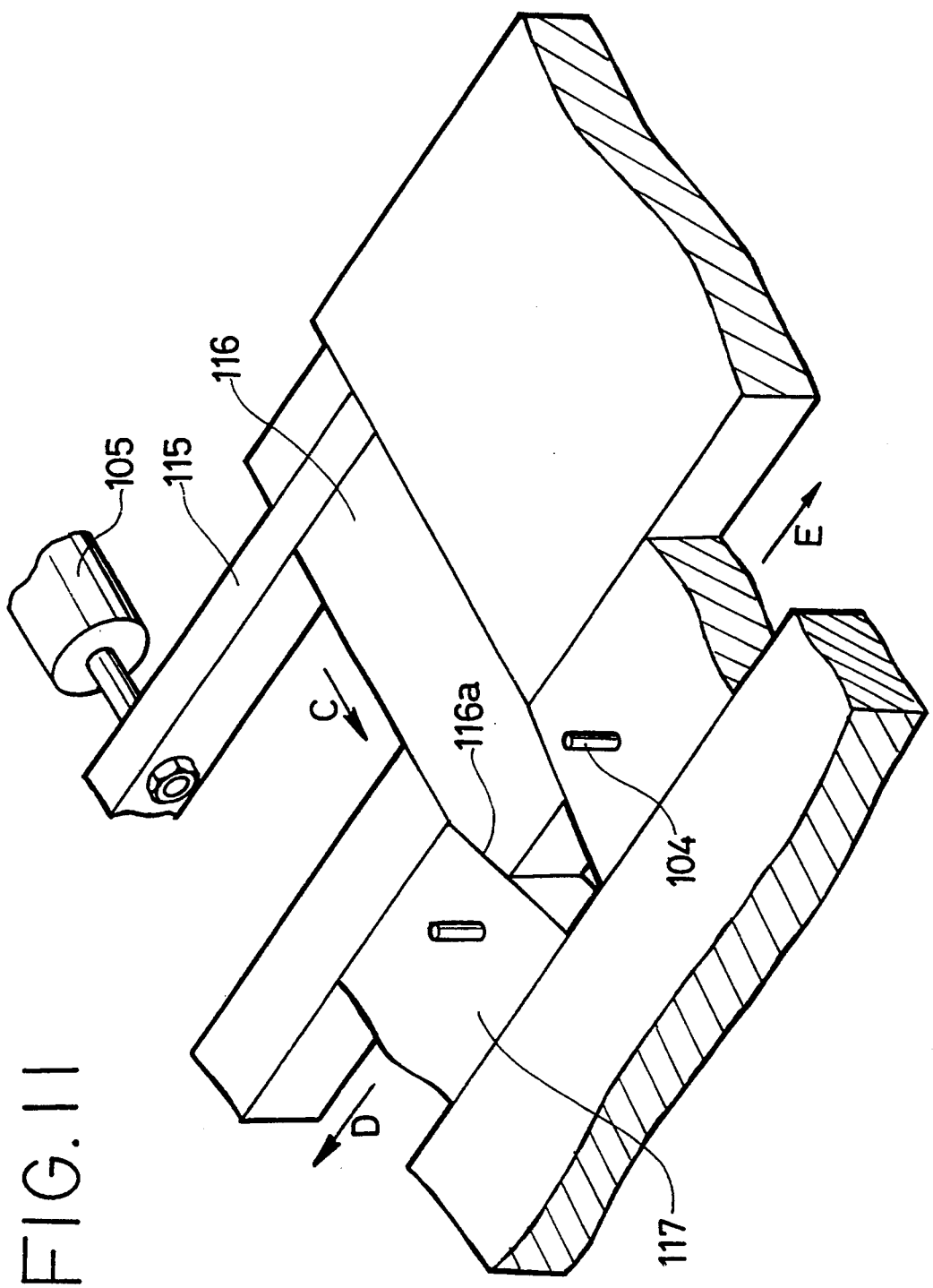

REUSABLE FIXTURE FOR CARRIER TAPE

BACKGROUND OF THE INVENTION

1. Field of the Invention

This invention relates to a reusable fixture for a carrier tape for holding a carrier tape of the TCP (Tape Carrier Package) type.

2. Description of the Related Art

In recent years, as high density mounting of IC (Integrated Circuit) and LSI (Large Scale Integration) packages onto circuit boards proceeds, the reduction in size and pitch and the increase in the number of pins of packages have been and are proceeding rapidly.

Therefore, attention is paid to TCPs of the TAB (Tape Automated Bonding) type with which reduction in size and reduction in pitch of packages can be anticipated sufficiently. The TCPs of the TAB type have the general structure of a small, thin IC package wherein IC chips are incorporated in a carrier tape and molded with a resin by transfer molding.

As the reduction in pitch and the increase in the number of pins proceed, it becomes difficult to keep fine lead terminals accurate until immediately before the package is mounted onto a circuit board. Therefore, it is a conventional practice to provide a reusable fixture as a guard ring and cut and form the carrier tape immediately before mounting the package onto a circuit board. The general structure of a reusable fixture for a carrier tape comprises a bottom element having a square hole formed at a central portion thereof for allowing bonding of an IC chip, a frame formed so as to surround the outer periphery of the bottom member in order to protect the carrier tape, and a tape holding member for holding the carrier tape to the bottom member in the frame. A conventional reusable fixture will be described below.

FIG. 1 is a schematic plan view of an example of a conventional reusable fixture disclosed in U.S. Pat. No. 4,069,496 and shows a condition wherein a carrier tape is fitted in the reusable fixture. FIG. 2 is a sectional view taken along line A—A of FIG. 1 showing the reusable fixture of FIG. 1.

As shown in FIGS. 1 and 2, the reusable fixture includes a reusable fixture body 54 on which a plurality of hook-shaped tape holding members 55 corresponding to sprocket holes 53 in a carrier tape 52 are provided integrally. The carrier tape 52 is connected to an IC chip 51 and held on the reusable fixture body 54 with the sprocket holes 53 thereof engaged with the tape holding members 55.

Another reusable fixture having a different structure for holding a carrier tape 52 is also known and shown in FIGS. 3 and 4.

FIG. 3 is a schematic plan view of another example of a conventional reusable fixture disclosed in U.S. Pat. No. 4,937,655 and shows a condition in which a carrier tape is fitted in the reusable fixture. FIG. 4 is an enlarged schematic view of a tape holding member of the reusable fixture shown in FIG. 3 and illustrates the relationship between the tape holding member and a jig. As shown in FIGS. 3 and 4, reusable fixture body 63 has resilient tape holding members 66 provided integrally at the four corners thereof. Meanwhile, an automated machine for mounting the carrier tape 62 onto the reusable fixture body 63 includes a jig 68 in the form of pins provided as engaging members for the tape holding members 66, the pins being movable in an opposing relationship to each other on straight lines toward the outer sides of the reusable fixture body 63. In the reusable fixture, the jig members 68 are first engaged with the respective tape holding members 66, and the tape holding members 66 are then simultaneously pulled to the outer sides (in the leftward and rightward directions in FIG. 3) and the tape positioning pins 64 of the reusable fixture body 63 are inserted into sprocket holes 65 of the carrier tape 62. Consequently, the carrier tape 62 is disposed at a predetermined position. When the jig members 68 are returned to their original positions, the tape holding members 66 restore the respective original positions due to their resiliency so that they extend above the four corners of the carrier tape 62, thereby holding the carrier tape 62 on the reusable fixture body 63.

However, with the reusable fixture of the prior art described above and shown in FIGS. 1 and 2, when the heads of the tape holding members 55 are passed through the sprocket holes 53 of the carrier tape 52, the sprocket holes 53 are expanded so forcibly by the tape holding members 55 that portions of carrier tape 52 around sprocket holes 53 may be deformed in such a manner as to cause the carrier tape 52 to bend up. In some cases, the carrier tape 52 may be cracked or broken.

If such deformation or damage actually occurs, the sprocket holes 53 of the carrier tape 52 may possibly be disengaged during transportation of the reusable fixture 54 on which the carrier tape 52 is mounted and the tape holding members 55 may release the carrier tape 52 from the reusable fixture body 54. Consequently, there is a problem in that the holding of the carrier tape 52 on the reusable fixture body 54 may become unstable.

With the reusable fixture shown in FIGS. 3 and 4, when the jig members 68 push simultaneously at the four locations to expand to the outer sides (in the leftward and rightward directions in FIG. 3) the tape holding members 66 which are movable in an opposing relationship to each other on the straight lines, since each of the tape holding members 66 is supported in a cantilever structure on the reusable fixture body 63, each tape holding member 66 is deformed around a fulcrum at the joining portion 67 thereof to the reusable fixture body 63, and thereupon, an arbitrary point of the tape holding member 66 will move in an arc.

As shown in FIG. 4, each jig member 68 moves in contact with the tape holding member 66a on a straight line in the direction of jig member movement 71 from the first contact point 69 at which it contacts the tape holding member 66a before the tape holding member 66a is deformed to a second contact point 70 at which it is in contact with the tape holding member 66 after the tape holding member 66a is deformed fully. Upon the movement of the jig member, the tape holding member 66 and the jig member 68 slidably move relative to each other, thereby producing powder as a result of friction. If the friction powder sticks between electrode terminals of a narrow pitch or to a bonding surface, an IC chip mounted on the reusable fixture may possibly be short-circuited.

The present invention has been made in view of the problems of the prior art described above, and it is an object of the present invention to provide a reusable fixture which allows a carrier tape to be mounted thereon using an apparatus of a simple structure and which does not produce powder from friction when the carrier tape is mounted and which in addition can hold the carrier tape precisely and securely.

SUMMARY OF THE INVENTION

In order to attain the objects described above, according to the present invention, there is provided a reusable fixture for a carrier tape which includes a bottom element for receiving either a carrier tape to which a semiconductor chip is bonded or another carrier tape to which no semiconductor chip is bonded as yet, a frame formed so as to surround an outer periphery of the bottom element in order to protect the carrier tape, and a pair of resilient tape holding members for holding the carrier tape onto the bottom element, characterized in that the tape holding members are pushed to expand by a pair of engaging members which are engageable with the tape holding members and movable in an opposing relationship on the same straight line to allow the carrier tape to be mounted, and the tape holding members are engaged at the opposite end portions thereof with at least one pair of opposing inner side faces of the frame so as to extend above the upper surface of the carrier tape mounted on the bottom element.

Each of the tape holding members may have a recessed portion formed thereon.

Further, the recessed portion may be formed at a central portion of each of the tape holding members.

With the reusable fixture for a carrier tape according to the present invention having the construction described above, when the tape holding members secured to at least one pair of the opposing inner side faces of the frame of the reusable fixture are pushed to expand to the outer sides, a space into which a carrier tape can be inserted is opened. A carrier tape is inserted into the space and the tape holding members are then returned to their respective original positions. As a result, the carrier tape is held by the tape holding members.

Further, when a carrier tape is inserted into the reusable fixture by an automated machine, the recessed portions of the tape holding members, which are formed so as to engage with engaging members provided on the automated machine, are pushed to expand to the outer sides by the engaging members, and thereupon, projected portions, which are formed continuously across the recessed portions, are pushed to expand along the recessed portions. As a result of the deformation of the tape holding members, the projected portions formed at positions at which they extend above the upper surface of a carrier tape are displaced to the outer sides so that a space into which a carrier tape can be inserted is opened. As described above, a carrier tape is then inserted into the space. Thereafter, the jigs are spaced away from the recessed portions of the tape holding members, and thereupon, the tape holding members return to their original positions. Consequently, the carrier tape is held by the tape holding members.

The above and other objects, features, and advantages of the present invention will become apparent from the following description referring to the accompanying drawings which illustrate an example of a preferred embodiment of the present invention.

BRIEF DESCRIPTION OF THE DRAWINGS

FIG. 6 is an enlarged schematic view of a tape holding member of the reusable fixture shown in FIGS. 5(a) and 5(b);

FIG. 8 is a perspective view showing a general construction of an embodiment of a carrier tape mounting jig of the present invention;

FIG. 11 is a perspective view showing a general construction of a moving mechanism for an engaging pin shown in FIG. 10.

DETAILED DESCRIPTION OF THE PREFERRED EMBODIMENTS

An embodiment of a reusable fixture according to the present invention will be described below with reference to the drawings.

Figure 1:
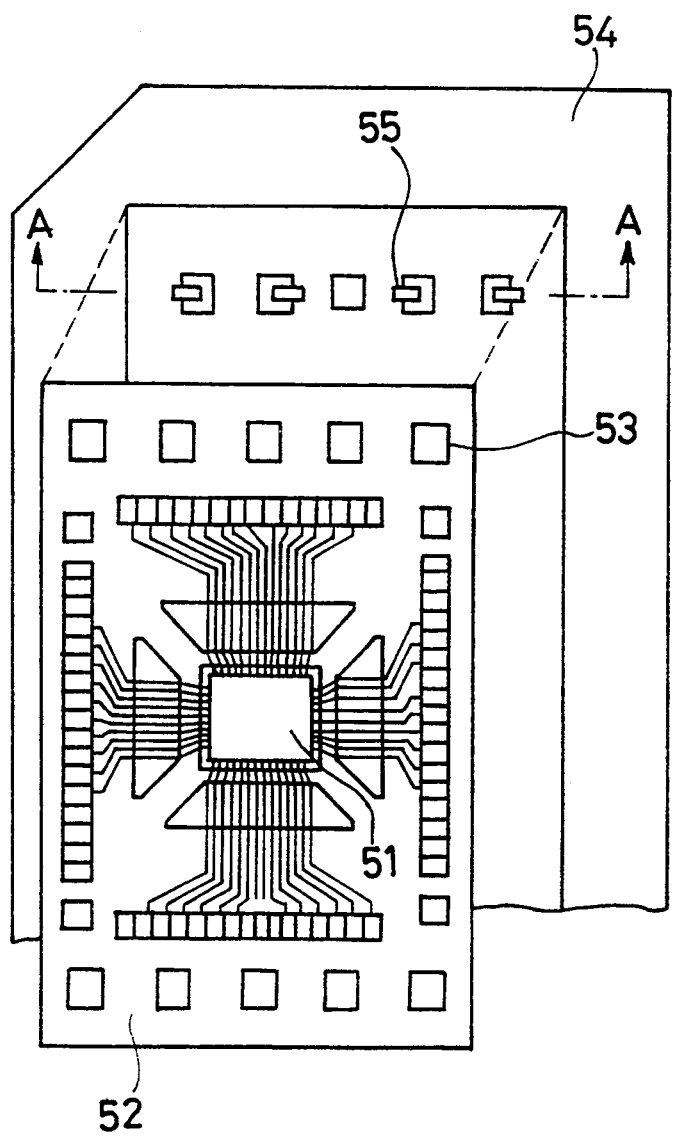
FIG. 1 is a schematic plan view of an example of a conventional reusable fixture and shows a condition wherein a carrier tape is fitted in the reusable fixture.
Figure 2:
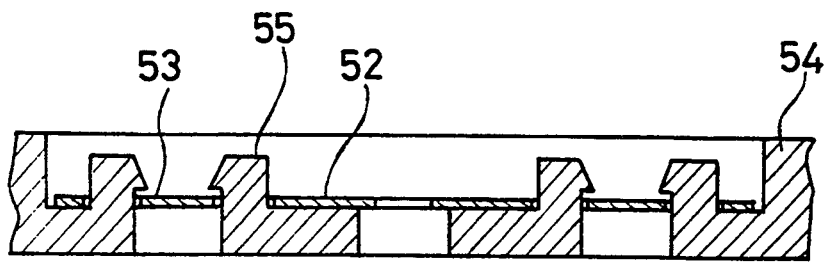
FIG. 2 is a sectional view taken along line A—A of the reusable fixture shown in FIG. 1.
Figure 3:
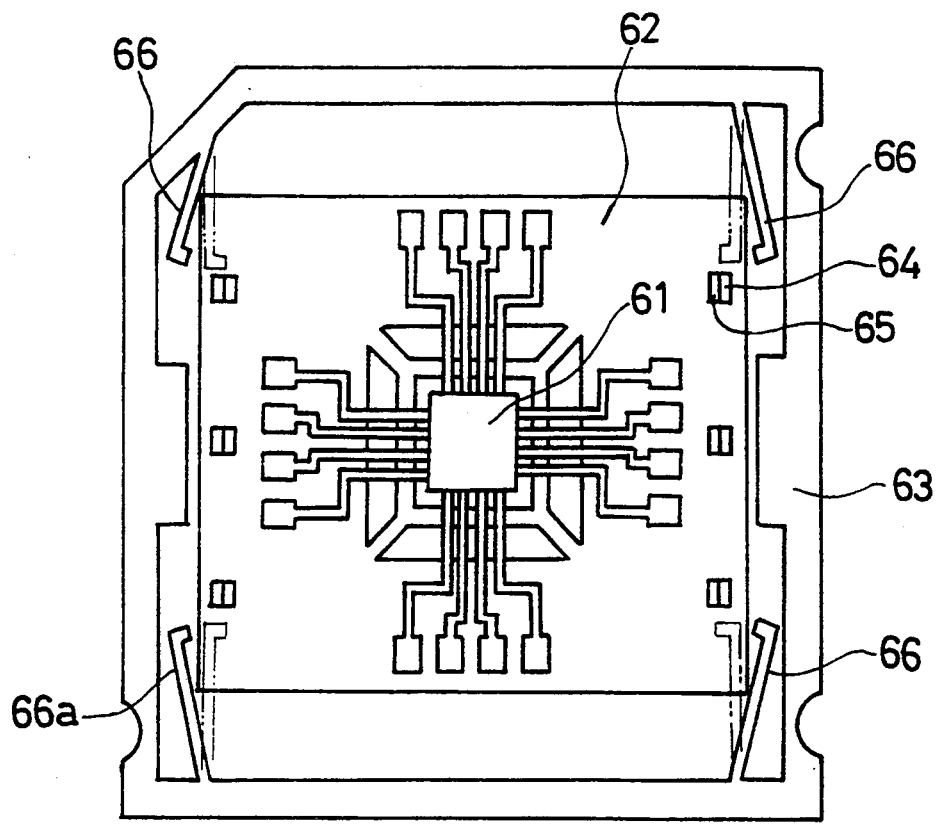
FIG. 3 is a schematic plan view of another example of a conventional reusable fixture and shows a condition wherein a carrier tape is fitted.
Figure 4:
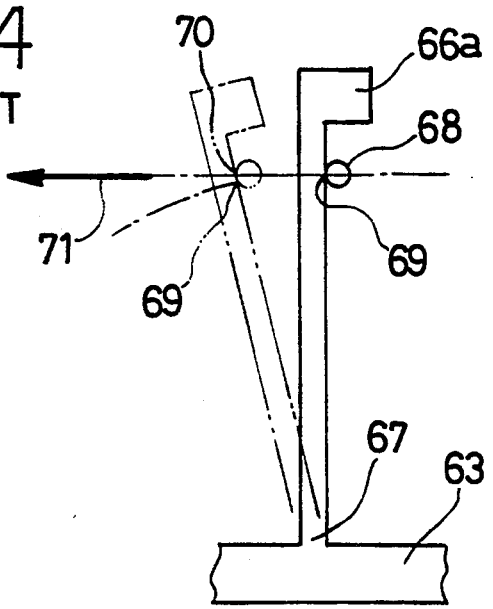
FIG. 4 is an enlarged schematic view of a tape holding member of the reusable fixture shown in FIG. 3 and illustrates the relationship between the tape holding member and a jig.
Figure 5A:
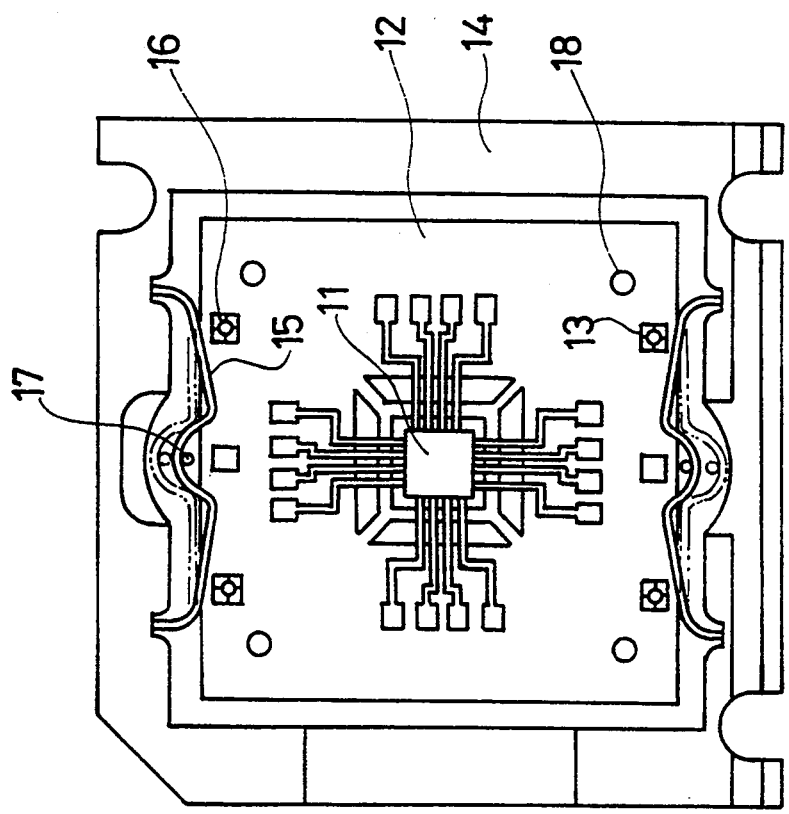
FIGS. 5(a) and 5(b) are schematic plan views of a reusable fixture of an embodiment of the present invention showing the form in which a carrier tape is held down by a tape holding member.

FIG. 5(a) is a schematic plan view of a reusable fixture of an embodiment of the present invention showing the form wherein a carrier tape is held down by a tape holding member. FIG. 6 is an enlarged schematic view of the vicinity around the tape holding member of the reusable fixture shown in FIG. 5(a).

As shown in FIG. 5(a), the reusable fixture for a tape carrier of the present embodiment includes a reusable fixture body 14 including a bottom element having an IC chip bonding hole formed therein in a member similar to the conventional reusable fixture and a frame for protecting an IC carrier tape. A carrier tape 12 is accommodated in the inside of the frame of the reusable fixture body 14. An IC chip 11 is mounted in the TAB system on the carrier tape 12. Square sprocket holes 13 are perforated at a fixed interval along the opposite sides of the carrier tape 12. Tape positioning pins 16 having a shape for engaging sprocket holes 13 are positioned at the same distance as the sprocket holes 13 in the bottom element of the reusable fixture body 14, and when a carrier tape is to be held, the tape positioning pins 16 are inserted into respective sprocket holes 13. It is to be noted that an IC chip 11 may .be mounted after the carrier tape 12 is secured on the reusable fixture 14.

The opposite ends of a pair of tape holding members 15 for holding a carrier tape 12 are secured to at least one pair of opposing inner side faces of the frame of the reusable fixture body 14. Alternatively, however, the opposite ends of the tape holding members 15 may not be secured. Each tape holding member 15 is so shaped that a recessed portion 15a is formed at a central portion of a resilient thin bow-shaped member so as to form a pair of projected portions 15b symmetrical to each other across the recessed portion 15a. The tape holding members 15 are secured simultaneously upon molding of the reusable fixture body 14 by molding means such as transfer molding or injection molding.

As a resin for use with the molding means for a reusable fixture, a polyphenylene ether resin such as, for example, "MASTALLOY POS 115EM7" (manufactured by Mitsui Toatsu Chemicals, Inc.) or a polyether sulphone resin such as, for example, "MASTALLOY ESP 300EG" (manufactured by Mitsui Toatsu Chemicals, Inc.) may be used.

The operation of mounting a carrier tape onto the reusable fixture using an automated machine will be described below with reference to the drawings.

FIG. 7 is a sectional view taken along line A—A of FIG. 6 and illustrates the operation of mounting a carrier tape onto the reusable fixture.

First, after the reusable fixture body 14 is mounted onto the automated machine, each of the jig members 17 formed from post-like pins provided on the automated machine below the reusable fixture and serving as engaging members is moved upwardly until it is engaged with the recessed portion 15a of a corresponding tape holding member 15 as shown in (a) of FIG. 7.

Then, the jig member 17 is moved toward the outer side (in the rightward direction in (b) of FIG. 7) on a straight line in order to provide a space sufficient to receive the carrier tape 12 on the reusable fixture as shown in (b) of FIG. 7. Upon the movement of the jig member 17, the tape holding member 15 is resiliently deformed to pull the recessed portion 15a and projected portions 15b to the outer side so that a space into which the carrier tape 12 can be inserted is formed on the reusable fixture body 14.

Figure 5B:
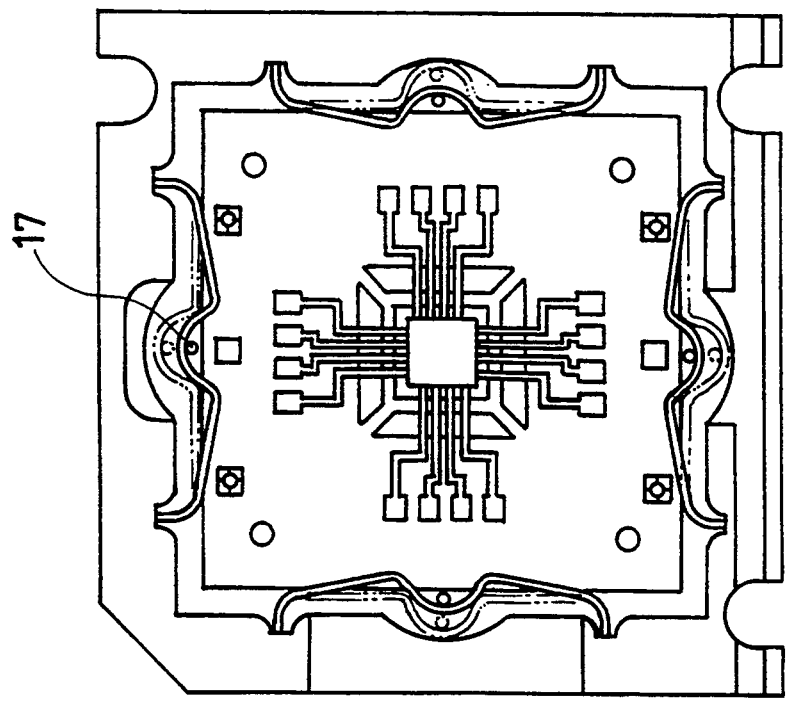
Figure 7A:
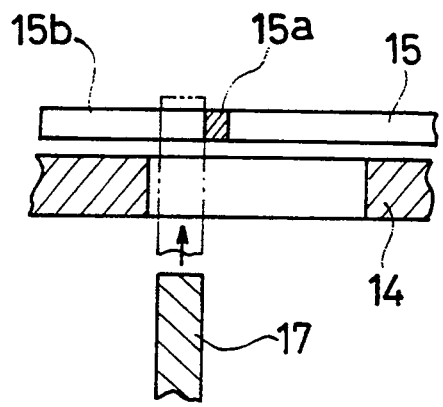
FIG. 7(a)–7(d) are sectional views taken along line A—A of FIG. 6 and illustrates operation of mounting the carrier tape onto the reusable fixture.
Figure 7B:
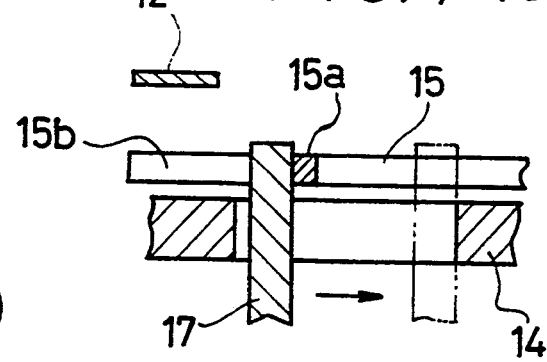
Figure 7C:
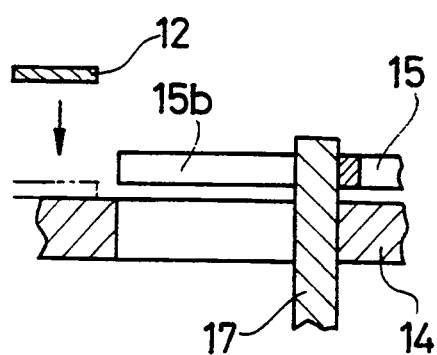
Figure 7D:
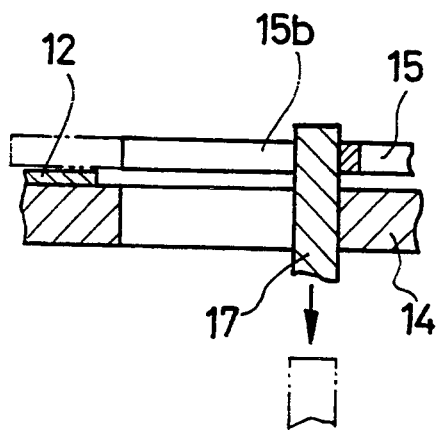

Thereafter, the carrier tape 12 is moved downwardly as shown in (c) of FIG. 7 until the sprocket holes 13 of the carrier tape 12 are engaged with the corresponding tape positioning pins 16 (refer to (a) of FIG. 5) provided on the bottom element of the reusable fixture. As a result, the carrier tape 12 is disposed on the bottom element of the reusable fixture.

Thereafter, the jig member 17 is moved downwardly as shown in (d) of FIG. 7 so that the tape holding member 15, which has been expanded outwardly, is returned to its original position shown in (a) of FIG. 7 by its own restoring force. Consequently, the carrier tape 12 disposed on the bottom of the reusable fixture is held by the projected portions 15b of the tape holding members 15.

With the reusable fixture of the present invention having the construction described above, the tape holding members 15 are pushed to expand by the jig members 17 to allow the carrier tape 12 to be mounted and thereafter secured on the reusable fixture. Consequently, no external force is applied to the carrier tape 12, and accordingly, there is no possibility that the carrier tape 12 will be broken or damaged. Further, since the recessed portions 15a are formed at the central portions of the tape holding members 15, the stability in engagement between the tape holding members 15 and the jig members 17 is enhanced. Furthermore, since a pair of the jig members 17 are moved in an opposing relationship on the same straight line without being displaced from the respective tape holding members 15, friction powder, which may otherwise be produced by the friction of the sliding movement between the jigs and the tape holding members, is not produced, and in addition, automation can be achieved readily.

In the present embodiment, although each tape holding member is shown secured at its opposite end portions at positions in the inner side of the frame of the reusable fixture body directly opposite an opposing tape holding member that is secured at its opposite end portions at positions in the opposing inner side face of the frame of the reusable fixture body, the positions of the tape holding members are not limited to those of the arrangement described above, and tape holding members may be provided on all of the four inner side faces of the frame as shown in (b) of FIG. 5, or two tape holding members may be provided along one inner side face of the frame at positions corresponding to two tape holding members provided on the opposing inner side face of the frame. Further, the recessed portion at the central portion of each tape holding member need not be provided. Further, the tape holding members need not be secured to the frame of the reusable fixture body but may be merely engaged with the frame.

Since the present embodiment is constructed as described above, the following effects are exhibited.

Since the tape holding members are secured opposite each other with their opposite end portions secured in the inner side faces of the reusable fixture and are positioned so that they extend above the upper face of the carrier tape, the reusable fixture can hold the carrier tape securely without damaging the carrier tape. Consequently, the reusable fixture will not release the carrier tape during transportation.

Further, because recessed portions are formed in the tape holding members and the tape holding members are engaged as an opposing pair, stability is achieved when engaging the engaging members with the tape holding members. In addition, the projected portions are formed adjacent to the recessed portion of each of the holding members and therefore hold down the carrier tape at two locations. In short, the carrier tape can be held down at four locations thereof by the two tape holding members. Consequently, compared with simultaneous movement of four tape holding members as in the prior art, it is only necessary to simultaneously move two opposing tape holding members in an opposing relationship to each other on the same straight line, and consequently, automation can be achieved readily.

Further, since the recessed portion is formed at the central portion of each of the tape holding members, when the jig members of the automated machine are engaged with the recessed portions of the tape holding members to move the tape holding members in an opposing relationship to each other straight toward the outer sides and away from each other, the positions at which the jig members and the recessed portions are engaged with each other are kept fixed during the movement. Consequently, the jig members can be moved without causing friction between the jig members and the recessed portions of the tape holding members. As a result, friction powder, which may otherwise be produced by the sliding movement between the tape holding members and the recessed portions, is not produced, and consequently, the quality of the IC carrier tape is maintained.

A second embodiment of the present invention will be described below with reference to the drawings.

FIG. 8 is a perspective view showing a general construction of the embodiment of a carrier tape mounting jig of the present invention.

The carrier tape mounting jig of the present embodiment is used when a carrier tape is to be mounted onto the reusable fixture shown in FIG. 5(a).

In the jig for mounting a carrier tape onto the reusable fixture of the embodiment shown in FIG. 5(a), each of the engaging members is engaged with a corresponding tape holding member, and the mechanism for moving the engaging members in an opposing relationship on the same straight lines is required to push the tape holding members to bend them simultaneously.

Another mechanism is also required to receive a large number of reusable fixtures thereon and push all of the tape holding members of the reusable fixtures, causing them to bend simultaneously.

Further, since a carrier tape has some distortion, if, after pushing the tape holding members to bend them simultaneously and placing a TCP (tape carrier package) onto the bottom of the reusable fixture, the tape holding members are released to allow them to extend above the upper surface of the tape, the tape holding members may contact and push against the edges of the carrier tape and prevent the carrier tape from being correctly mounted, and accordingly, a mechanism for preventing this problem is also required.

In the present embodiment, the carrier tape mounting jig shown in FIG. 8 includes a reusable fixture receiving plate 102 removably provided on the upper surface of a jig body 101. Positioning pins 103 for positioning the reusable fixture shown in FIG. 5 are provided fixedly at predetermined locations on the reusable fixture receiving plate 102 so that a reusable fixture can be placed at a predetermined position of the reusable fixture receiving plate 102. A pair of engaging pins 104 project from the reusable fixture receiving plate 102 and are mounted for movement in an opposing relationship to each other on the same straight line so that when a reusable fixture is to be received at the predetermined position by the positioning pins 103, the engaging pins 104 are engaged with the recessed portions of a pair of tape holding members of the reusable fixture. The pair of engaging pins 104 are moved in an opposing relationship to each other on the same straight line by driving a driving mechanism, which will be hereinafter described, by means of an air cylinder 105 mounted on the rear side surface of the jig body 1. It is to be noted that the positioning pins 103 and engaging pins 104 in FIG. 8 are provided so that a pair of reusable fixtures may be placed onto the reusable fixture receiving plate 102 parallel to each other as viewed in the direction indicated by arrow A.

Meanwhile, a pair of lid mounting elements 106 for supporting a lid 107 for opening and closing in a pivotal motion in the directions indicated by double-sided arrow B are provided fixedly at the opposite end portions of the rear side surface of the jig body 101. A handle 108 for facilitating manual opening and closing operations of the lid 107 is provided on the lid 107. When the operator manually operates the handle 108 to close the lid 107 to the reusable fixture receiving plate 102 side, the lid 107 is supported on supporting pins 109 securely mounted on the reusable fixture receiving plate 102, and the holding plate 107a of the lid 107 bridges the two supporting portions 107b so that it covers a reusable fixture placed at the predetermined position when the lid 107 is supported on the supporting pins 109 in this manner. Further, holding pins 110 are mounted at predetermined positions on a surface of the holding plate 107a adjacent the reusable fixture receiving plate 102 and are biased in a direction perpendicular to the surface of the holding plate 107a by resilient members such as compression coil springs.

Figure 9A:
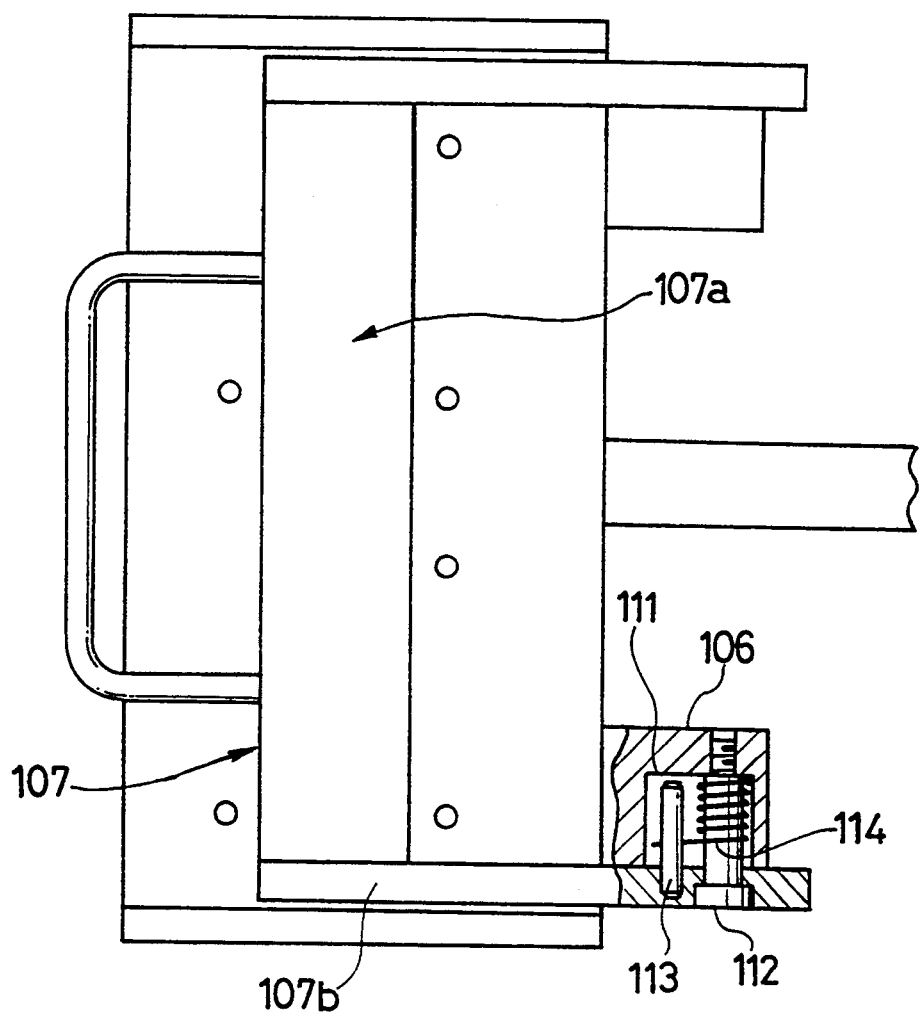
FIG. 9 is a schematic constructive view of the carrier tape mounting jig shown in FIG. 8 with a lid closed, FIG. 9(a) being a plan view and FIG. 9(b) being a right-hand side elevational view.
Figure 9B:
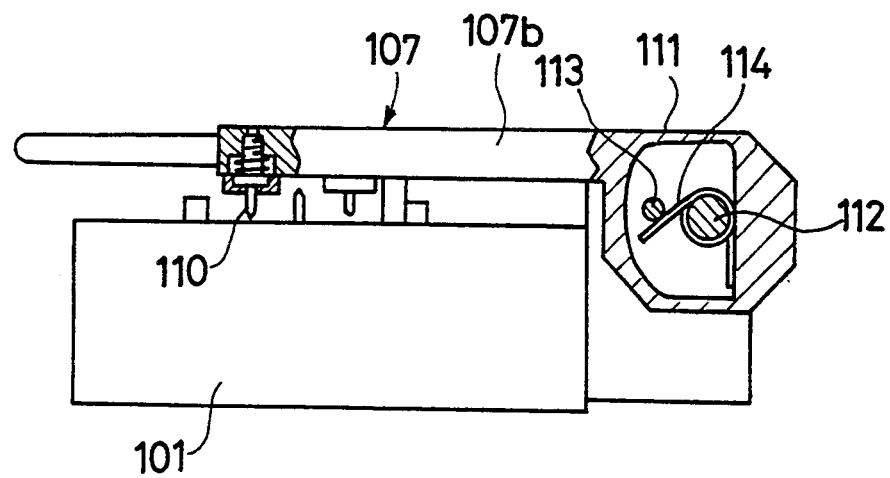

FIG. 9 is a schematic constructive view of a closed state of the lid of the carrier tape mounting jig shown in FIG. 8, and FIG. 9(a) being a plan view and FIG. 9(b) being a right-hand side elevational view.

As shown in (a) and (b) of FIG. 9, each of the lid mounting elements 106 for supporting the entire lid 107 for the opening and closing pivotal motion has a hole 111 therein. A shaft 112 is screwed into the bottom of each hole 111 and extends toward the opening of the hole. An end portion of the shaft 112 extending toward the opening of the hole supports the supporting element 107b for the opening and closing pivotal motion with play left between the end portion of shaft 112 and the supporting element 107b. Further, a pin 113 is mounted fixedly on the supporting element 107b supported for pivotal motion on the lid mounting element 106 and is accommodated in the hole 111. A torsion coil spring 114 is disposed on the outer periphery of the shaft 112 in such a manner that one of the opposite ends of torsion coil spring 114 contacts the inner side face of the hole 111 and the other end thereof engages the pin 113. Consequently, when the lid 107 is pivoted toward the jig body 101 side, the biasing force of the torsion coil springs 114 acts upon the pins 113 in the direction to open the lid 107, and accordingly, the pivoting downward motion of the lid 107 is restrained. Therefore, a lid 107 of large weight can be closed slowly, and the operator's hands are protected from being pinched by the lid 106. It is to be noted that the biasing force of the torsion coil springs 114 is set arbitrarily in accordance with the weight of the lid 107.

Next, the driving mechanism for moving the engaging pins in an opposing relationship on the same straight line will be described.

Figure 10:
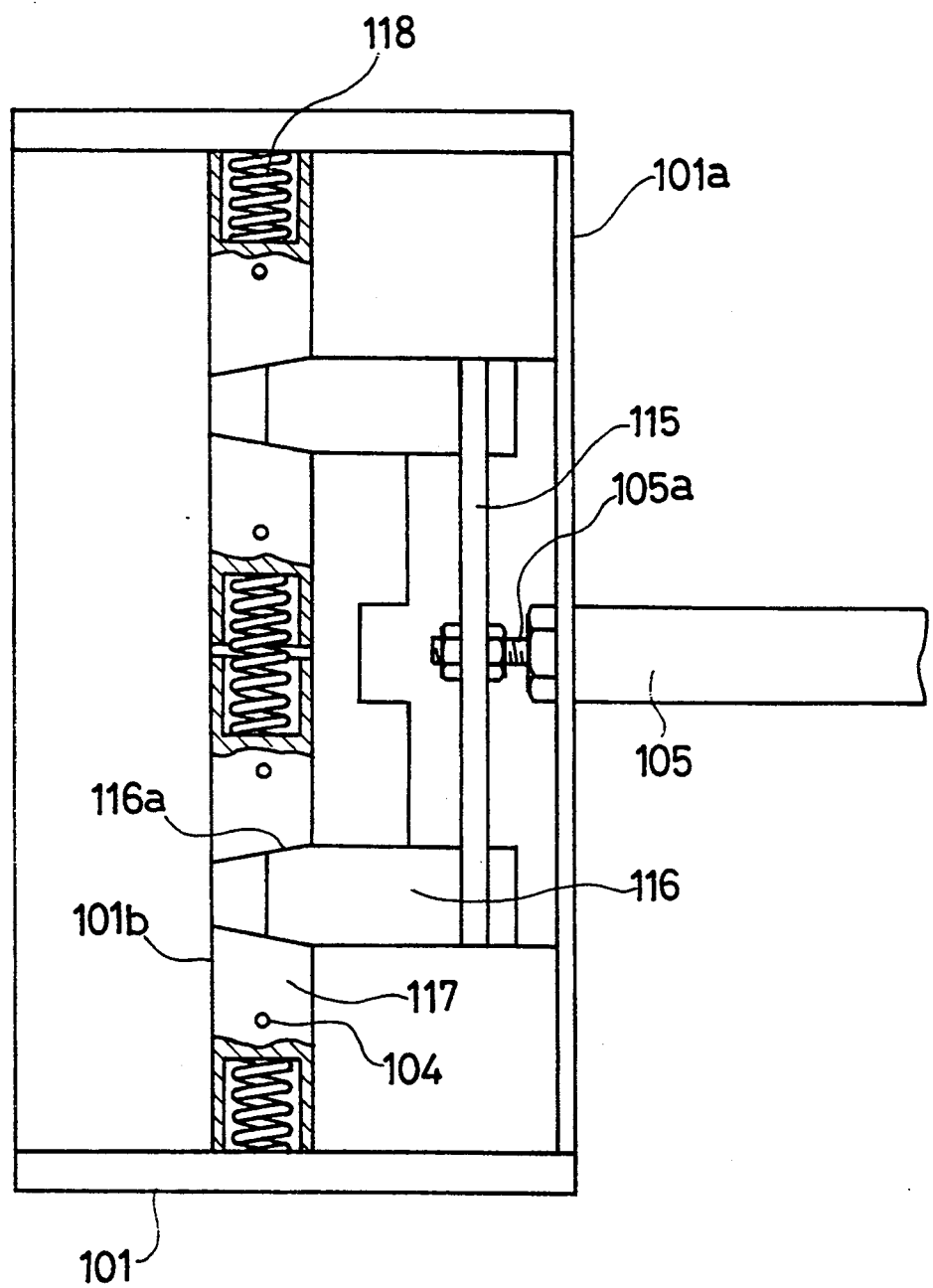
FIG. 10 is a plan view showing a condition wherein a reusable fixture receiving plate of the carrier tape mounting jig of the present invention is removed from a jig body.

FIG. 10 is a plan view showing a condition wherein the reusable fixture receiving plate of the carrier tape mounting jig of the present invention is removed from the jig body, and FIG. 11 is a perspective view showing a general construction of the engaging pin driving mechanism shown in FIG. 10.

As shown in FIG. 10, an air cylinder 105 is mounted at a central portion of the rear side surface 101a of the jig body 101, and a supporting element 115 is secured to an end of the cylinder shaft 105a by means of a bolt, this supporting element 115 supporting a pair of movable elements 116 at its opposite ends. Each movable element 116 is in the form of a rectangular parallelepiped having a chamfered portion 116a formed at an end face thereof remote from rear side face 101a of the jig body 101.

Meanwhile, a slot 101b is formed in a straight line in each block in the jig body 101. The chamfered portion 116a of each movable element 116 can advance into the corresponding slot 101b, and a pair of engaging pin supporting elements 117 for supporting the engaging pins 104 are accommodated for sliding movement on opposite sides of each chamfered portion 116a. The engaging pin supporting elements 117 are retained in such a manner that they are always in contact with both sides of the movable elements 116 under the biasing force of compression coil springs 118. Here, the surfaces of the engaging pin supporting elements 117 in contact with the chamfered faces 116a are individually chamfered similarly to the chamfered portions 116a.

With the above-described construction, when the movable element 116 is pushed in the direction indicated by arrow C by the air cylinder 105 as shown in FIG. 11, the chamfered portions 116a of the movable elements 116 move the engaging pin supporting elements 117 on both sides of the movable element 116 in an opposing relationship to each other on the same straight line in the directions (in the direction indicated by arrow mark D and the direction indicated by another arrow mark E) such that they move away from each other. Thereupon, the engaging pins 104 are also moved in an opposing relationship on the same straight line in the directions such that they move away from each other.

On the other hand, when the movable elements 116 are returned in the direction opposite to the direction of arrow C by the air cylinder 105, since the engaging pin supporting elements 117 on both sides of the chamfered portions 116a of the movable elements 116 are normally biased by the compression coil springs 118 (refer to FIG. 10) in the directions such that the movable elements 116 are in constant contact on the chamfered portions 116a of both sides with the engaging pin supporting elements 117, the engaging pins 104 are returned to the respective original positions by the movement of the movable elements 116. It is to be noted here that an air switch not shown is used for driving the air cylinder 105.

A carrier tape mounting operation using the carrier tape mounting jig will be described below.

In the present embodiment, a part is mounted onto the conventionally employed reusable fixture shown in FIG. 5. The mounting operation will be described below.

FIG. 12 is a schematic sectional view illustrating the carrier tape mounting operation using the embodiment of a carrier tape mounting jig of the present invention.

As shown in FIG. 12 (a), the operator places and positions the reusable fixture 19 on the upper surface of the reusable fixture receiving plate 102. In this instance, the engaging pins 104 which project for movement in an opposing relationship on the same straight line from the reusable fixture receiving plate 102 are engaged at predetermined locations of the tape holding members 119a.

Figure 12A:
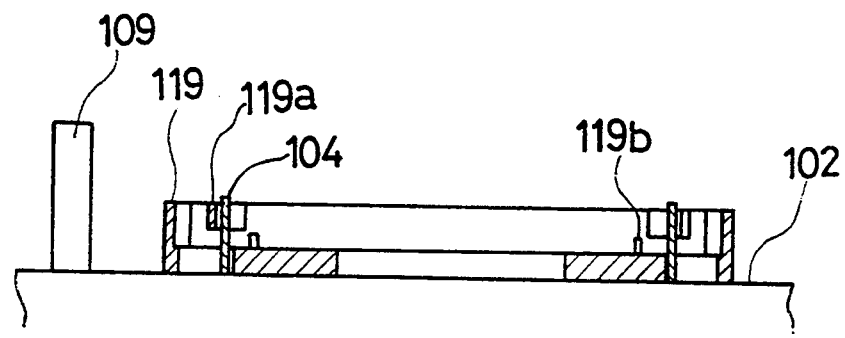
FIGS. 12(a)–12(d) are schematic sectional views illustrating a carrier tape mounting operation using the embodiment of a carrier tape mounting jig of the present invention.
Figure 12B:
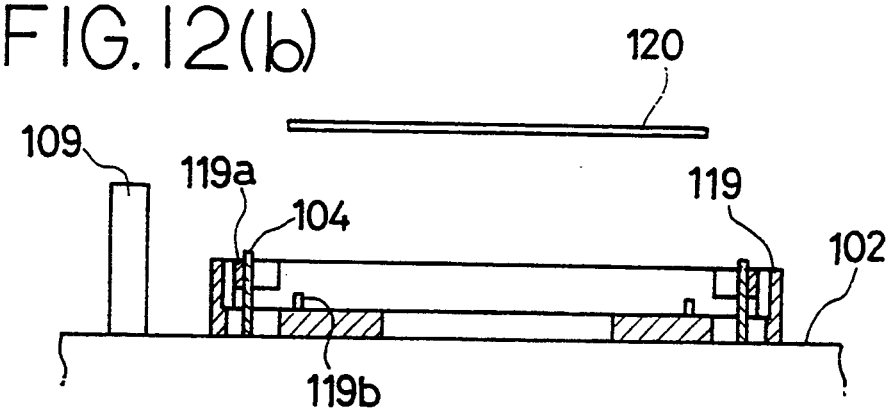

Then, the moving mechanism for the engaging pins 104 described above is operated. Consequently, the engaging pins 104 are moved on the straight line in directions such that they move away from each other as shown in FIG. 12(b) so that they push against and bend the respective tape holding members 119a. As a result, a condition wherein a carrier tape 120 can be mounted onto the reusable fixture 119 is established.

Figure 12C:
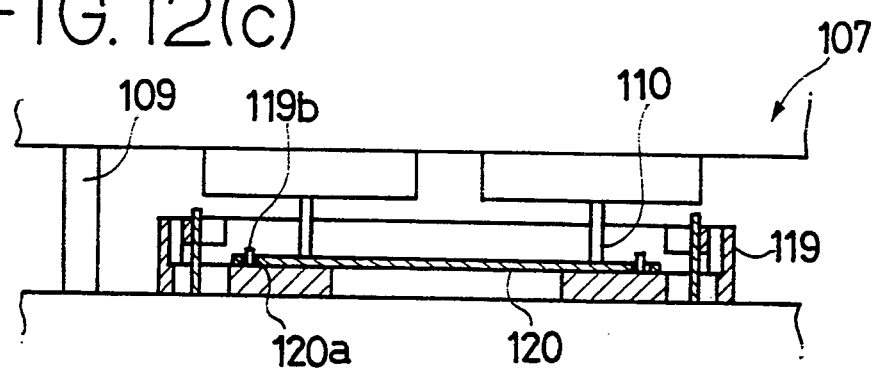
Figure 12D:
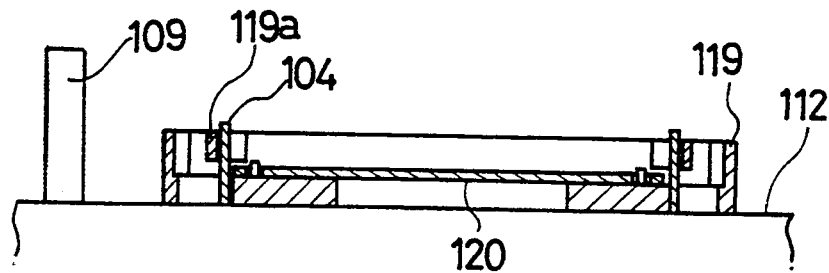

The operator then engages the sprocket holes 120a of the carrier tape 120 with the tape positioning pins 19b of the reusable fixture 119 as shown in FIG. 12(c), places and positions the carrier tape 120 onto the reusable fixture 119, and then closes the lid 107 in this condition. In this instance, the lid 107 is supported on the supporting pins 109 fixedly provided on the reusable fixture receiving plate 102, and the holding pins 110 individually biased by springs or like elements hold down the surface of the carrier tape 120 to temporarily straighten bends or like deformations in the tape. Here, since the supporting pins 109 for supporting the lid 107 are provided, the surface of the tape is acted upon only by the biasing force of the holding pins 110.

In the state wherein the lid 107 is closed, the operator activates the moving mechanism for the engaging pins 104 to return the engaging pins 104 to their original positions. Consequently, the tape holding members 119 will extend above the end portions of the upper surface of the carrier tape 120 and secure the carrier tape 120.

Finally, the operator opens the lid 107 and takes out the reusable fixture 119 on which the carrier tape 120 is mounted from the reusable fixture receiving plate 102, thereby completing the operation.

In the present embodiment, although an air cylinder is used for the engaging pin moving mechanism, the present invention is not limited to this form, and a hydraulic or electric actuator which can achieve linear driving movement may alternatively be employed. Further, while the operator performs placement of the reusable fixture and mounting of a carrier tape, an automated machine exclusively designed for such use may be employed. Further, while the jig of the present embodiment can receive two reusable fixtures, the jig is not limited to this specific construction and may alternatively be constructed so as to receive one or a plurality of reusable fixtures.

In the present embodiment of the construction described above, after a plurality of reusable fixtures are placed at the predetermined positions of the reusable fixture receiving plate on the same straight line, the pair of engaging pins which are movable on the same straight line are engaged with the tape holding members of each of the reusable fixtures. Then, when the plurality of pairs of engaging pins are moved simultaneously on the same straight line by the driving mechanism in directions such that they move away from each other, the tape holding members of the reusable fixtures are pushed by the engaging pins to bend simultaneously. Consequently, a condition wherein a carrier tape can be mounted onto the bottom of each of the reusable fixtures is established.

Then, when carrier tapes are mounted onto the bottoms of the reusable fixtures and the upper surfaces of the carrier tapes are held down by the holding pins of the holding elements and the plurality of pairs of engaging pins are moved simultaneously on the same straight line by the driving mechanism in directions such that they approach each other, the tape holding members of the reusable fixtures are engaged with certainty with the upper surfaces of the carrier tapes, thereby holding the carrier tapes.

As described above, since the present invention is constructed so that a plurality of reusable fixtures can be placed on the same straight line at the predetermined positions of the reusable fixture receiving plate, and the tape holding members of the reusable fixtures are pushed to bend simultaneously by pairs of engaging pins which are movable on the same straight line for engagement with the tape holding members of the reusable fixtures, a plurality of carrier tapes can be mounted readily at one time.

Further, since the holding elements are provided having holding pins for holding down the upper surfaces of the carrier tapes when the carrier tapes are placed on the bottoms of the reusable fixtures, the carrier tapes will be reformed for any distortion and the tape holding members will therefore extend above the upper surfaces of the carrier tapes. Consequently, incorrect mounting of a tape due to distortion of the tape can be prevented.

Although variations of the embodiment described above are possible, the scope of the present invention is defined in the appended claims.

What is claimed is:

1. A resuable fixture for a carrier tape, comprising a bottom element for receiving one of a carrier tape to which a semiconductor chip is bonded and a carrier tape to which a semiconductor chip is be bonded, a frame extending around an outer periphery of said bottom element in order to protect the carrier tape, said frame having inner side faces, and at least a pair of resilient tape holding members for holding the carrier tape on said bottom element, each tape holding member having two ends, said tape holding members being temporarily deformed by at least a pair of engaging members that are engageable with said tape holding members and movable in an opposing relationship along a common straight line so as to allow the carrier tape to be mounted on the bottom element, the two ends of each tape holding member being joined and fixed at the inner side faces of said frame at a position so as to allow at least a portion of each tape holding member to overlie an edge of the carrier tape mounted on said bottom element.

2. A reusable fixture for a carrier tape as set forth in claim 1, wherein each of said tape holding members has a recessed portion formed thereon.

3. A reusable fixture for a carrier tape as set forth in claim 2, wherein said recessed portion is formed at a central portion of each of said tape holding members.

4. A reusable fixture for a carrier tape as set forth in claim 2, wherein said recessed portion of each tape holding member is spaced from the edges of the carrier tape, each tape holding member having two portions positioned on opposite sides of the recessed portion which overlie the edge of the tape carrier.

* * * * *